(12) United States Patent
Fricke et al.

(10) Patent No.: US 6,661,691 B2
(45) Date of Patent: Dec. 9, 2003

(54) INTERCONNECTION STRUCTURE AND METHODS

(75) Inventors: Peter Fricke, Corvallis, OR (US); Andrew Koll, Albany, OR (US); Andrew L. Van Brocklin, Corvalllis, OR (US); Daryl Anderson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 99 days.

(21) Appl. No.: 10/115,763

(22) Filed: Apr. 2, 2002

(65) Prior Publication Data

US 2003/0185033 A1 Oct. 2, 2003

(51) Int. Cl.$^7$ .................................................. G11C 5/06
(52) U.S. Cl. ............................ 365/63; 365/51; 365/103; 365/105
(58) Field of Search ........................... 365/63, 51, 103, 365/105

(56) References Cited

U.S. PATENT DOCUMENTS

| | | | |
|---|---|---|---|
| 3,271,591 A | 9/1966 | Ovshinsky | 307/88.5 |
| 3,530,441 A | 9/1970 | Ovshinsky | 340/173 |
| 3,641,516 A | 2/1972 | Castrucci et al. | 340/173 SP |
| 4,499,557 A | 2/1985 | Holmberg et al. | 365/163 |
| 4,599,705 A | 7/1986 | Holmberg et al. | 365/163 |
| 5,335,219 A | 8/1994 | Ovshinsky et al. | 369/288 |
| 5,625,220 A | 4/1997 | Liu et al. | 257/530 |
| 5,659,500 A | 8/1997 | Mehrad | 365/185.05 |
| 5,751,012 A | 5/1998 | Wolstenholme et al. | 257/5 |
| 5,821,558 A | 10/1998 | Han et al. | 257/52 |
| 5,835,396 A | 11/1998 | Zhang | 365/51 |
| 5,942,777 A | 8/1999 | Chang | 257/296 |
| 5,949,710 A * | 9/1999 | Pass et al. | 365/185.05 |
| 6,002,607 A | 12/1999 | Dvir | 365/103 |
| 6,026,017 A | 2/2000 | Wong et al. | 365/185.05 |
| 6,033,955 A | 3/2000 | Kuo et al. | 438/257 |
| 6,034,882 A | 3/2000 | Johnson et al. | 365/103 |
| 6,111,302 A | 8/2000 | Zhang et al. | 257/530 |
| 6,122,209 A * | 9/2000 | Pass et al. | 365/201 |
| 6,185,121 B1 | 2/2001 | O'Neill | 365/94 |
| 6,185,122 B1 | 2/2001 | Johnson et al. | 365/103 |
| 6,351,406 B1 | 2/2002 | Johnson et al. | 365/103 |
| 2001/0011776 A1 | 8/2001 | Igarashi et al. | 257/776 |
| 2001/0055838 A1 | 12/2001 | Walker et al. | 438/129 |

OTHER PUBLICATIONS

Victor W.C. Chan et al., "Multiple Layers of CMOS Inegrated Circuits Using Recrystallized Silicon Film" IEEE Electron Device Letters, V. 22, No. 2 (Feb. 2001) pp. 77–79.
Thomas H. Lee, "A Vertical Leap for Microchips," Scientific American, Jan. 2002, pp. 53–59.
Esmat Hamdy et al., "Dielectric based antifuses for logic and memory ICs" IEEE International Electron Devices Meeting, IEDM 88 (Aug. 1988) pp. 786–789.
Chenming Hu, "Interconnect devices for field programmable gate array." IEEE International Electron Devices Meeting, IEDM 92 (Apr. 1992) pp. 591–594.
Jonathan Green et al., "Antifuse Field Programmable Gate Arrays" Proc. IEEE vol. 81 No. 7 (Jul. 1993), pp. 1042–1056.
Vivek D. Kulkarni et al. "Patterning of Submicron Metal Features and Pillars in Multilevel Metallization" J. Electrochem. Soc. vol. 135 No. 12 (Dec. 1988) pp. 3094–3098.

* cited by examiner

Primary Examiner—Michael S. Lebentritt
Assistant Examiner—Pho M. Luu (57) ABSTRACT

Interconnection structures for integrated circuits have a first array of cells, at least a second array of cells parallel to the first array, and interconnections disposed for connecting cells of the first array with cells of the second array, at least some of the interconnections being disposed along axes oriented obliquely to the first and second arrays. First and second sets of oblique axes of interconnections may be parallel or opposed to each other. The interconnections may include obliquely slanted pillars or stair-stepped pillars disposed along the oblique axes. Methods for fabricating and using such structures are disclosed.

46 Claims, 10 Drawing Sheets

INTERCONNECTION STRUCTURE AND METHODS

RELATED APPLICATIONS

This application is related to application Ser. No. 10/051, 677 filed Jan. 16, 2002 and assigned to the same assignee.

FIELD OF THE INVENTION

This application relates to interconnection structures especially useful in semiconductor devices such as integrated circuits and memory devices and relates to methods for fabricating and using such structures.

BACKGROUND ART

Integrated circuits including arrays of memory nodes or logic gates have increased steadily in density. Such integrated circuits have included dynamic random access memory (DRAM) devices, static random access memory (SRAM) devices, programmable read-only memory (PROM) integrated circuits, electrically erasable programmable read-only memory (EEPROM) integrated circuits, write-once read-many (WORM) memory devices, and logic devices such as programmable logic array (PLA) integrated circuits, among others. Integrated circuits having arrays of devices, gates, or memory nodes disposed on multiple levels require "vertical" interconnections or "pillars" to interconnect devices, gates, or memory nodes on one level with other devices, gates, or nodes on other levels. In this context, the term "vertical" differs from its everyday connotation in that it does not refer to the direction of gravity. Throughout this specification, the drawings, and the appended claims, the term "vertical" refers to a direction generally perpendicular to a substrate or base plane of an integrated circuit. Also, the term "pillar" referring to an interconnection and the term "vertical interconnection" are used interchangeably to mean an interconnection communicating between different layers of an integrated circuit, regardless of the spatial orientation of those different layers. Integrated circuits herein include not only monolithic integrated circuits, but also hybrid integrated circuits and multi-layer or "stacked" modules. The term "cell" herein refers to a functional element of an array, such as a memory node, a logic gate, a switching device, a field-effect device, or a semiconductor device.

There is a continuing need for increased device density in integrated circuits, including multi-layer integrated circuits and for efficient interconnection structures within such multi-layer integrated circuits.

BRIEF DESCRIPTION OF DRAWINGS

To clarify features and advantages of the invention, a detailed description of the invention will be rendered by reference to specific embodiments thereof, which are illustrated in the appended drawings. The same numbers are used throughout the drawings to refer to like features and components. It will be appreciated that these drawings depict only typical embodiments of the invention and are therefore not to be considered limiting of its scope. The invention will be described and explained with additional specificity and detail through the use of the accompanying drawings in which.

DETAILED DESCRIPTION OF EMBODIMENTS

For clarity of exposition, the drawings are not drawn to any uniform scale. In particular, vertical and horizontal scales may be different, and thus angles may be smaller or larger than in devices as fabricated, but angles described in the following description are shown in the drawings at scales suitable for clarity.

The invention is described herein first in terms of a general structure, associated methods of fabrication, and methods of use, and then in terms of various specific embodiments, including memory structures and associated methods. A person skilled in the field of integrated circuits will understand that corresponding structures may be made and corresponding methods of the invention may be practiced in various kinds of integrated circuits, such as the programmable logic array (PLA) integrated circuits, the hybrid integrated circuits, or the stacked modules mentioned above.

One aspect of the invention is an interconnection structure having first and second sets of wiring channels disposed in generally parallel planes and a third set of wiring channels oriented obliquely to the parallel planes, the wiring channels of the third set being adapted for electrically coupling selected wiring channels of the first set with selected wiring channels of the second set. This aspect is exemplified by various particular embodiments described below.

An embodiment of a structure 10 made in accordance with the invention may be used in integrated circuits. In this embodiment of the invention (illustrated in FIGS. 1–5), the interconnection structure 10 comprises a first array 20 of cells 30 and at least a second array 40 of cells 50, and interconnections 60 disposed for connecting cells of the first array with cells of the second array. Cells 30 and 50 are normally of the same type. First array 20 is disposed generally in a plane 70, and second array 40 is disposed generally in a plane 80, generally parallel to plane 70. Arrays 20 and 40 may be separated by an insulating layer 35. At least some of those interconnections 60 are disposed along axes 90 oriented obliquely to the planes 70 and 80 of first and second arrays 20 and 40. That is, the axes 90 along which the interconnections 60 are arranged are at an oblique angle 100 (neither parallel nor perpendicular) to the planes of the arrays. Each of the interconnections 60 is selectively coupled by an electrical coupling to a cell 30 or 50 of each array. The electrical coupling may simply be an ohmic connection, for example. Each cell of the arrays may include a semiconductor device, such as a diode or transistor. The cells of the arrays may function as logic gates, memory cells, or perform some other useful function.

Figure 1:
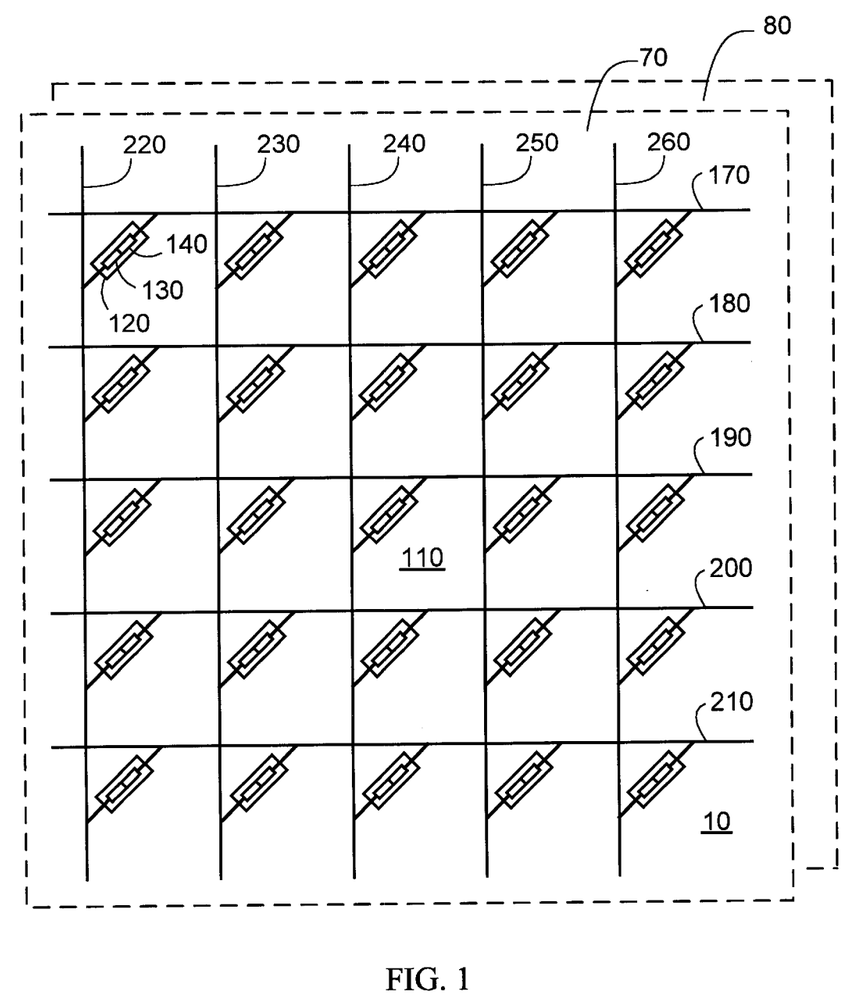
FIG. 1 shows a schematic diagram illustrating elements of a memory to which interconnection embodiments made in accordance with the invention may be applied.

FIG. 1 shows a schematic diagram illustrating elements of a memory 110 to which interconnection embodiments made in accordance with the invention may be applied. Memory cells 120 in such structures may be of a type having a storage element 130, such as a capacitor, and a control element 140, such as a diode or a switching transistor. As is known in the art, the function of the storage element may be provided by built-in capacitance intrinsic to the physical structure, instead of by a discrete capacitor device. The storage element 130 of each memory cell 120 may be connected in series with the control element 140 of that memory cell. In some read-only memories (ROM's), no control element is needed. In some embodiments, e.g., write-once memories, the control element 140 may be integral (at least initially) with the storage element 130 rather than being a distinct discrete structure. Memory cells 120 are arranged in multiple arrays on parallel layers or planes such as planes 70 and 80.

A suitable memory cell 120 may include, for example, a control element in series with a voltage breakdown element. The control element may be, for example, an electrically linear resistive element, i.e., an element that has a linear change in current for a linear change in voltage. The voltage breakdown element may be an antifuse, i.e., an element whose resistance is normally high, and switches to a low-resistance when a suitable signal is applied. Various antifuses are known in the art, being disclosed, for example, in U.S. Pat. Nos. 5,821,558 and 6,111,302.

The control element can be composed of various materials, such as a refractory metal silicide nitride (e.g., tungsten silicide nitride), intrinsic silicon, or lightly doped microcrystalline silicon or lightly doped amorphous silicon. The latter material, lightly doped amorphous silicon, can reversibly enhance its current flow by lowering its resistance when a suitable voltage is applied, allowing such an element to function as a switch. In application of this function in a memory, all memory cells (e.g., all the control elements) in a row conductor are turned on when the row conductor is energized because all the control elements reach a relatively low resistance. Conversely, the memory cells that are not selected by being energized will maintain a relatively high resistance. Memory cell 120 may include a "phase change" material that can be electrically switched between generally amorphous and generally microcrystalline states, such as the materials disclosed in U.S. Pat. Nos. 3,271,591 and 3,530, 441. Application of such materials to memories is known in the art and disclosed in U.S. Pat. No. 4,499,557; U.S. Pat. No. 4,599,705, and U.S. Pat. No. 5,335,219, for example. The voltage breakdown element may be composed of an electrically insulating material such as oxide-nitride-oxide (ONO), tantalum pentoxide ($Ta_2O_5$), plasma-enhanced silicon nitride, titanium oxide, germanium oxide, or a chemical-vapor-deposited (CVD) dielectric including a deposited oxide, a grown oxide, or similar dielectric materials.

Another suitable memory cell 120 may include a tunnel junction device. A tunnel junction device has electrical characteristics such that, for linear increases in voltage, the tunnel junction exhibits an exponential increase in current. Such a memory cell has an advantage in access speed over many other types of cells, since it is capable of being accessed in a time of the order of a few nanoseconds or less.

In memory 110, row conductors and column conductors form an orthogonal set of wiring channels, and individual memory cells are addressed by a combination of a row conductor, e.g., a word line, and a column conductor, e.g., a bit line.

It will be recognized that other types of integrated circuits, such as field-programmable gate arrays (FPGA's) also require wiring channels to address their cells, such as the individual gates of the gate array.

As shown in FIG. 1, memory 110 has a set of row conductors such as row conductors 170, 180, 190, 200, and 210 and a set of column conductors such as column conductors 220, 230, 240, 250, and 260, arranged parallel to layers or planes such as planes 70 and 80. Each row conductor can be a word line for memory 110, and each column conductor a bit line.

While only a few memory cells, planes, row conductors, and column conductors are shown in FIG. 1, it will be understood that memory 110 may consist of many such elements, and the arrangement depicted schematically in FIG. 1 may be extended both in the two directions (e.g., along conventional x- and y-axes parallel to each plane) and along a z-axis perpendicularly to the planes, i.e., having multiple planes.

In addition to the row and column conductors, a set of vertical interconnections or pillars 300 may be provided (FIG. 3), extending from one plane to another for connecting one or more memory cells in a first plane with one or more memory cells in another plane. In conventional memories, such vertical interconnections or pillars 300 are arranged along axes 310 oriented generally perpendicularly to the planes.

In an interconnection structure embodiment made in accordance with the invention, each cell of an array is disposed at the intersection of an obliquely angled pillar conductor 400 or a stair-stepped pillar conductor 410 with one of the arrays of cells. Interconnection 60 comprises a series of conductors or conductive pillars 400 and/or 410. When obliquely angled conductors 400 are employed, as shown in FIG. 2, the axis 420 of each pillar itself is oblique to the planes of the arrays, and the associated pillars are substantially aligned along a common oblique axis 90.

Figure 3:
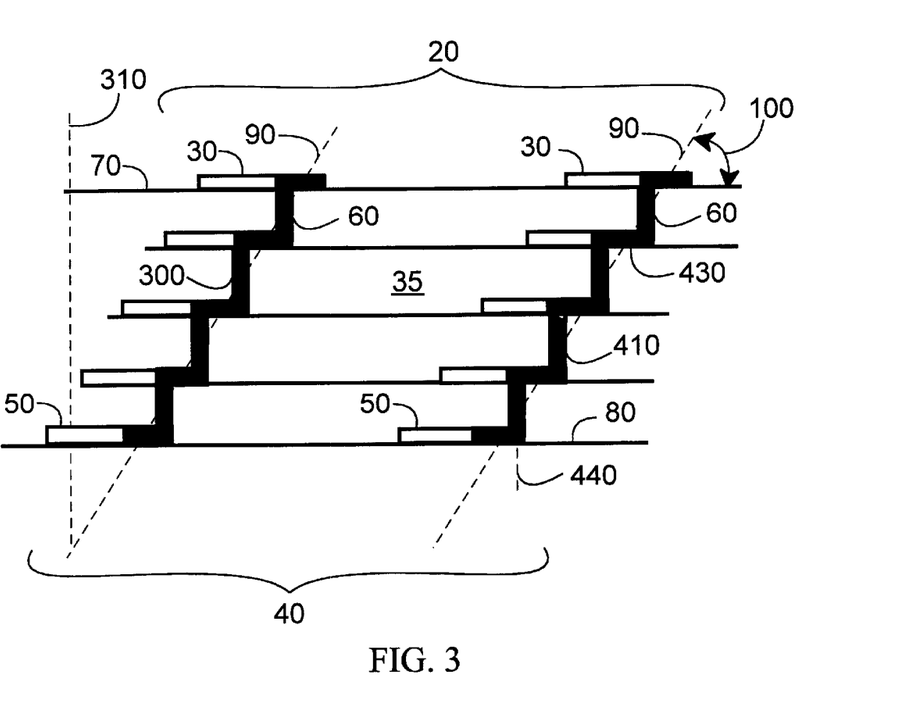
FIG. 3 shows a side elevation cross-sectional view of stair-stepped interconnection embodiments made in accordance with the invention.

In an interconnection 60 comprising a series of stair-stepped pillar conductors 410, as shown in FIG. 3, the position of each associated pillar 410 is along an axis 90 oblique to the planes of the arrays, but the axis 440 of each pillar itself is not aligned parallel to the oblique axis 90. In particular, the axis 440 of each pillar of the stair-stepped conductors may be substantially perpendicular to the plane of the arrays, as it is in the example shown in FIG. 3. In the embodiment of FIG. 3, interconnections 60 may also include conductive trace segments 430 on, within, or parallel to the plane 70 or 80 of each array 20 or 40 for connecting associated pillars.

Figure 2:
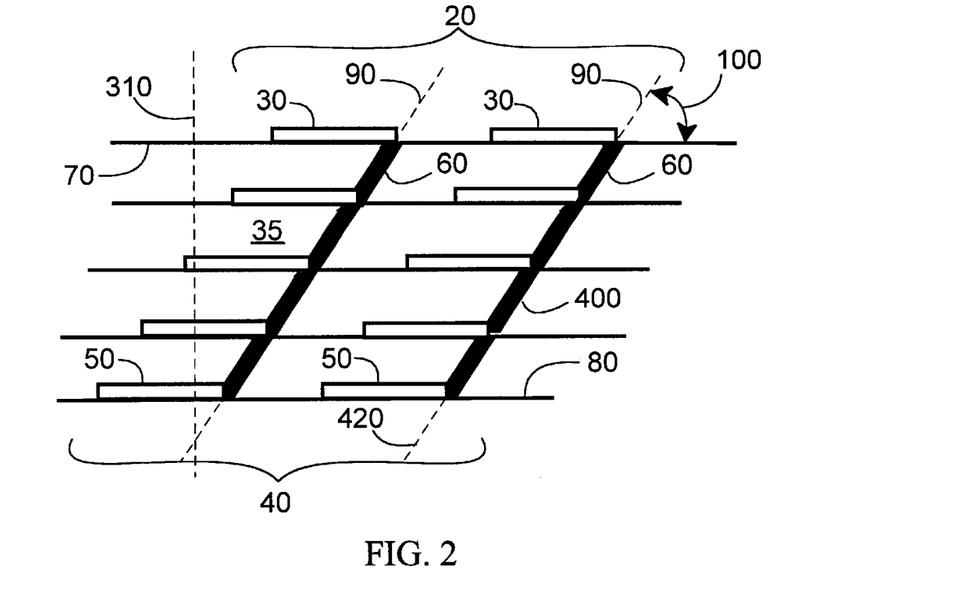
FIG. 2 shows a side elevation cross-sectional view of angled interconnection embodiments made in accordance with the invention.

It will be recognized that the embodiments shown in FIGS. 2 and 3 are not mutually exclusive, but represent two types of interconnection which may be combined in a single interconnection structure. Thus, a structure 60 made in accordance with the invention may include not only obliquely angled pillar conductors 400 substantially parallel to oblique axis 90, and stair-stepped pillar conductors 410 substantially perpendicular to planes 70 and 80, but also pillar conductors whose individual pillar axes 440 have neither of those orientations. The latter individual pillar axes 440 may be made oblique to both axis 90 and planes 70 and 80 (e.g., at an intermediate angle).

Figure 4A:
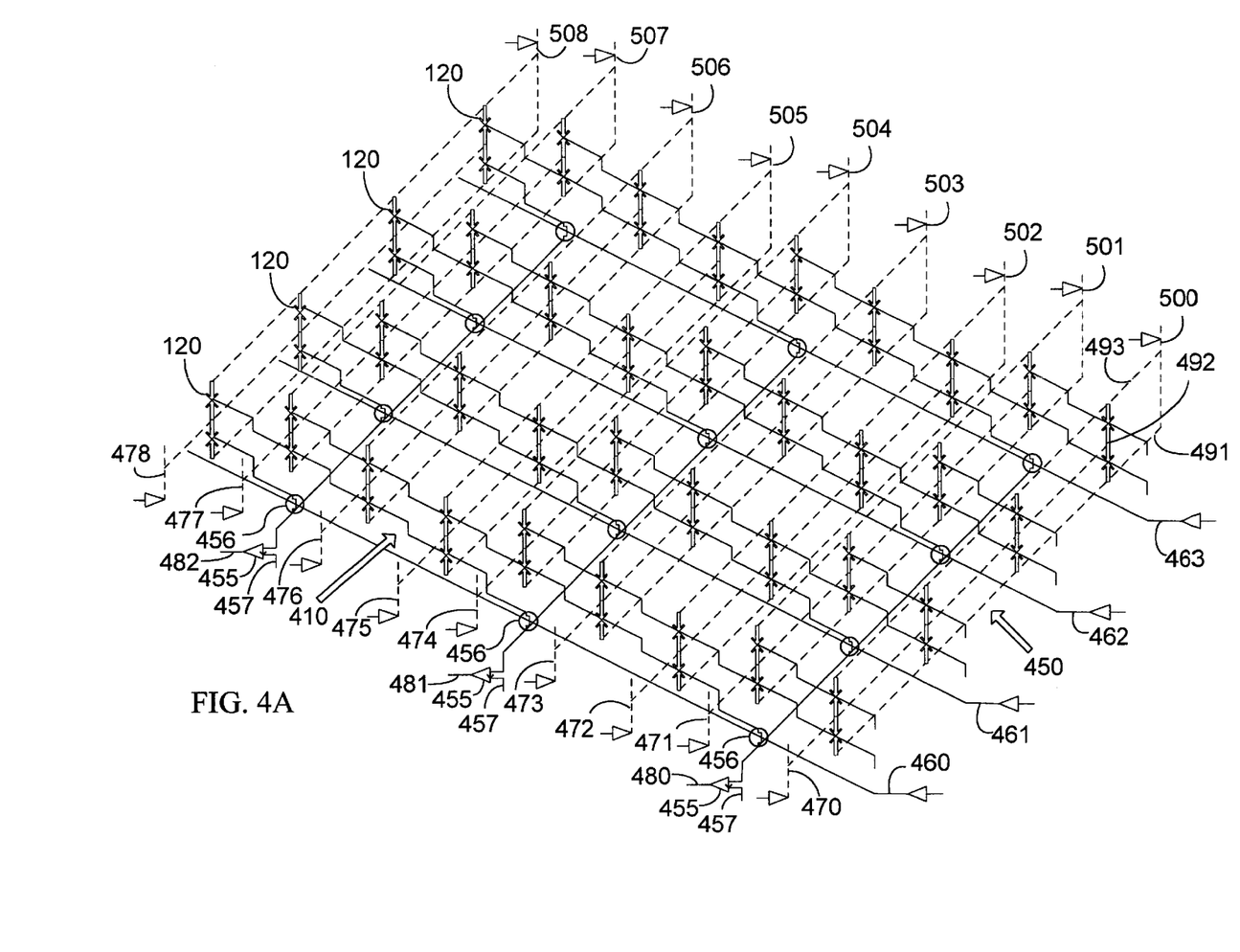
FIG. 4A shows a schematic perspective view of a first embodiment having a set of interconnections made in accordance with the invention.
Figure 4B:
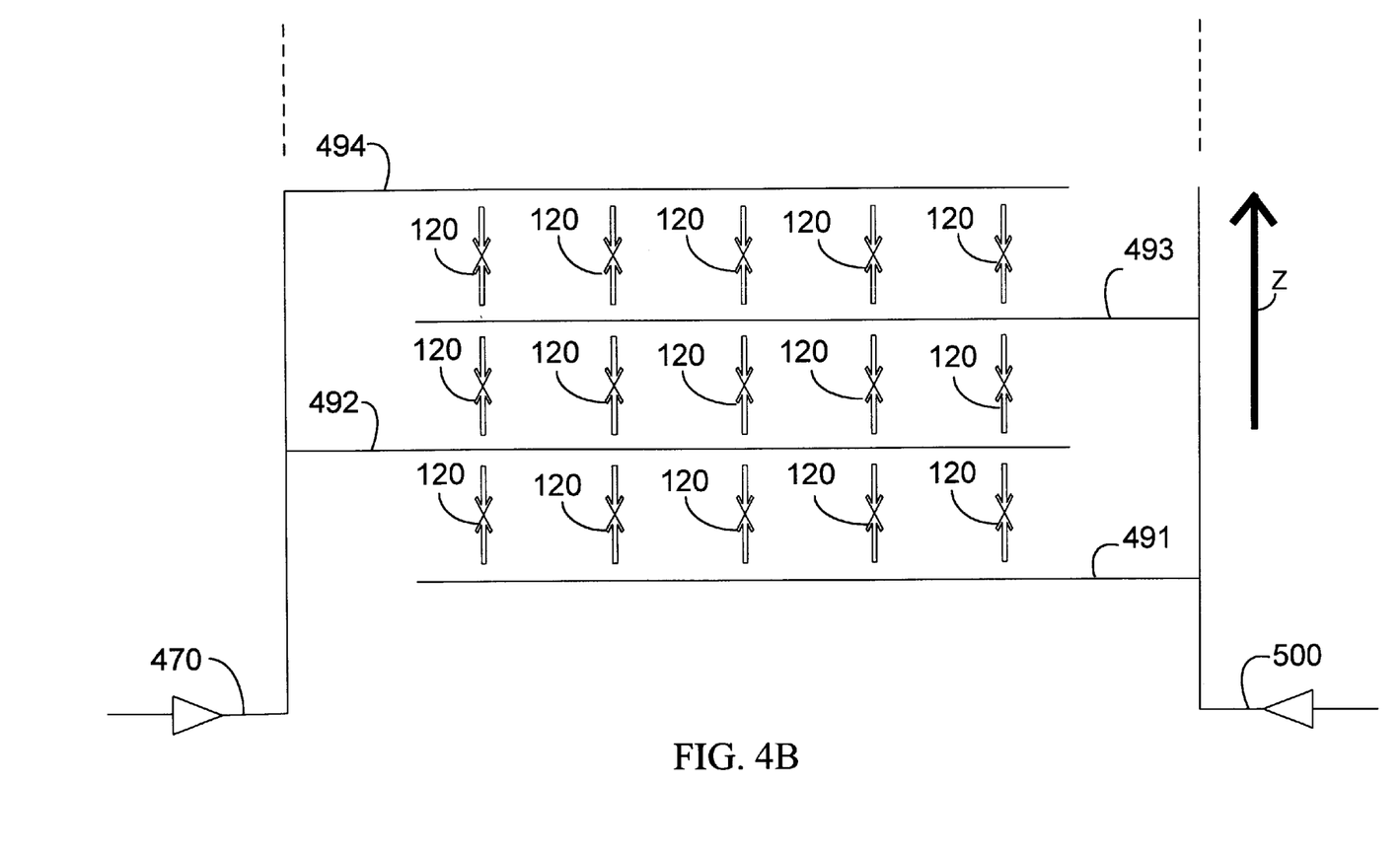
FIG. 4B shows a schematic end elevation view of the embodiment of FIG. 4A.
Figure 4C:
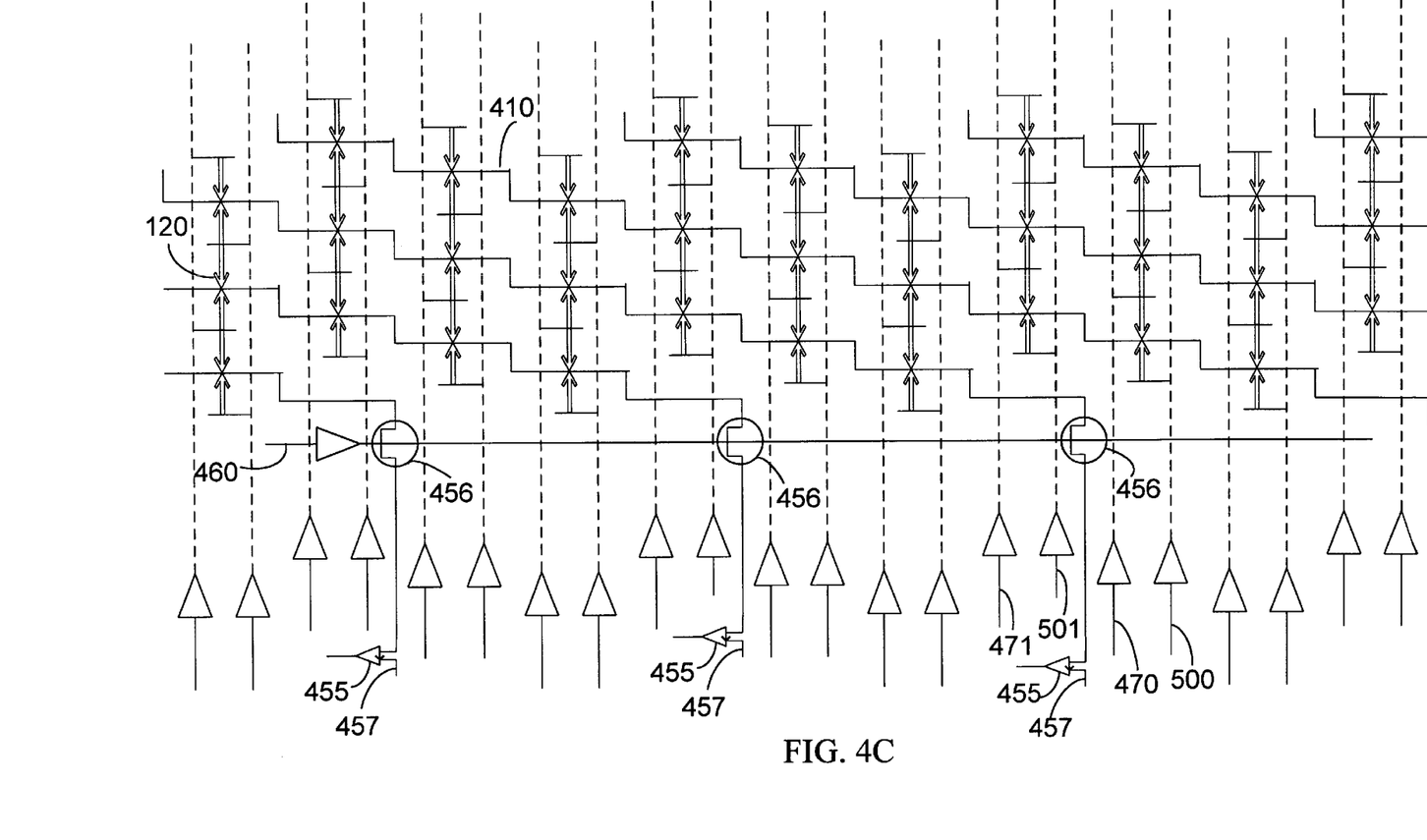
FIG. 4C shows a schematic side elevation view of the embodiment of FIG. 4A.

FIGS. 4A–4C show various schematic views of a first embodiment including interconnections made in accordance with the invention. FIG. 4A is a schematic perspective view showing arrays of memory cells 120 arranged in a three-dimensional configuration and interconnected by stair-stepped pillar interconnections 410. The interconnections 410 shown in FIG. 4A are disposed along axes obliquely oriented with respect to the planes of the arrays in which memory cells 120 are arranged. A schematic end elevation view of the embodiment of FIG. 4A is shown in FIG. 4B, and a schematic side elevation view of the same embodiment is shown in FIG. 4C. As shown in FIGS. 4A and 4C, all of the interconnections 410 are disposed along oblique axes that are parallel. FIGS. 4A–4C show vertically stacked rows 450 along with row select lines SEL 0 (460), SEL 1 (461), SEL 2 (462), and SEL 3 (463), base semiconductor control devices 456, and sense amplifiers 455 selectively connected to $V_{array}$ (457) with associated outputs OUT 0 (480), OUT1 (481), and OUT 2 (482). Also shown in FIGS. 4A–4C are rows 0M (470), 1M (471), 2M (472), 3M (473), 4M (474), 5M (475), 6M (476), 7M (477), and 8M (478); and row 0–8 planes (500–508), each of which includes layers L1, L2, and L3 (identified by reference numerals 491, 493, and 494 only for row 0 (500) and reference numeral 492 only for row 4m (470)).

As shown in schematic end view, FIG. 4B, memory cells 120 are arranged generally aligned in the vertical direction and in parallel planes. As shown in schematic side view, FIG. 4C, stair-stepped vertical pillar interconnections 410, interconnecting memory cells 120 of the arrays are disposed along axes oblique to the planes of memory cells 120. FIGS. 4A and 4C show select line 460, sense amplifiers 455, base semiconductor control devices 456, and, along the bottom of FIG. 4C, a set of row selection lines corresponding to the rows of the array, e.g., 470, 471, 500, and 501.

Figure 5A:
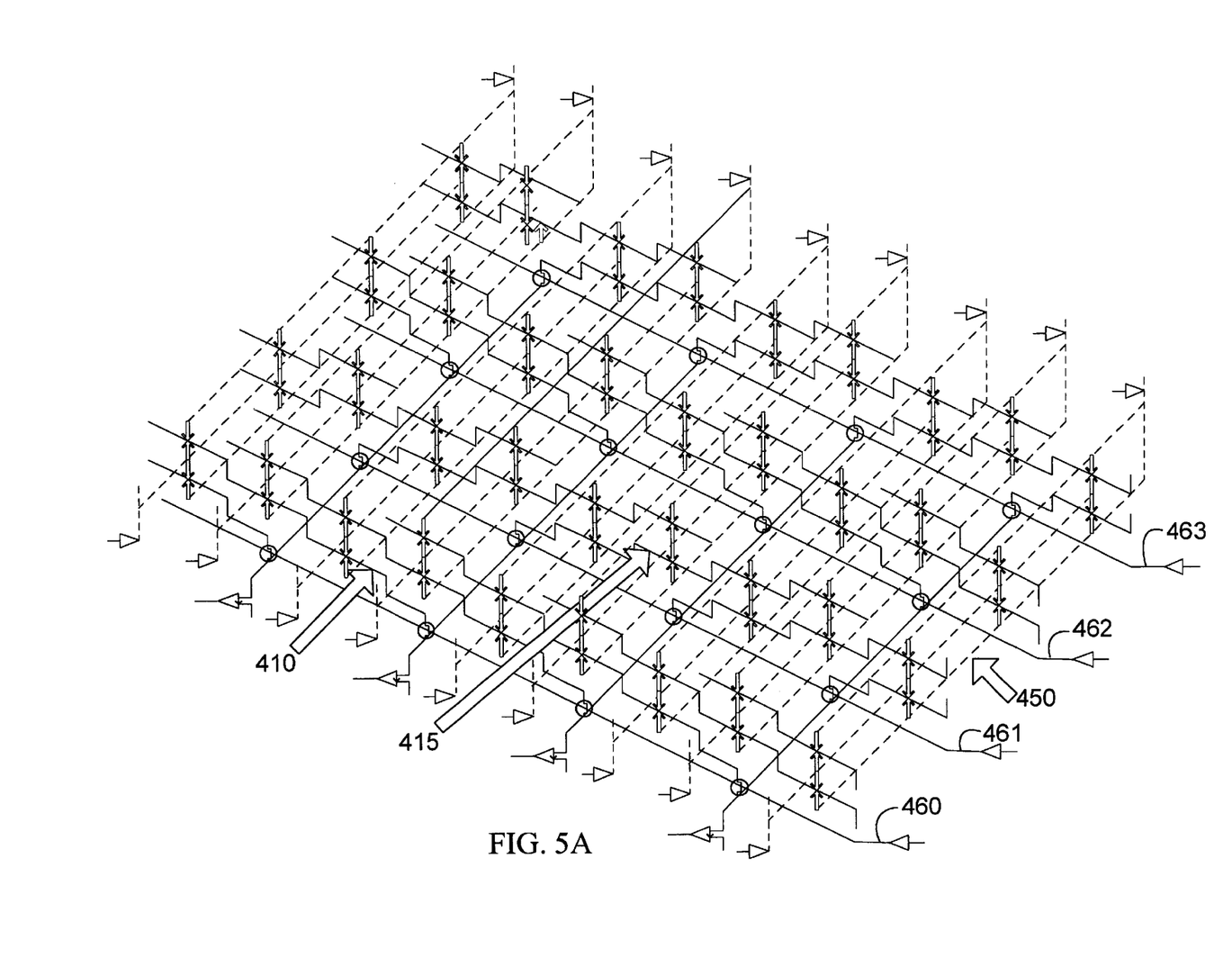
FIG. 5A shows a schematic perspective view of a second embodiment having a set of interconnections made in accordance with the invention.
Figure 5B:
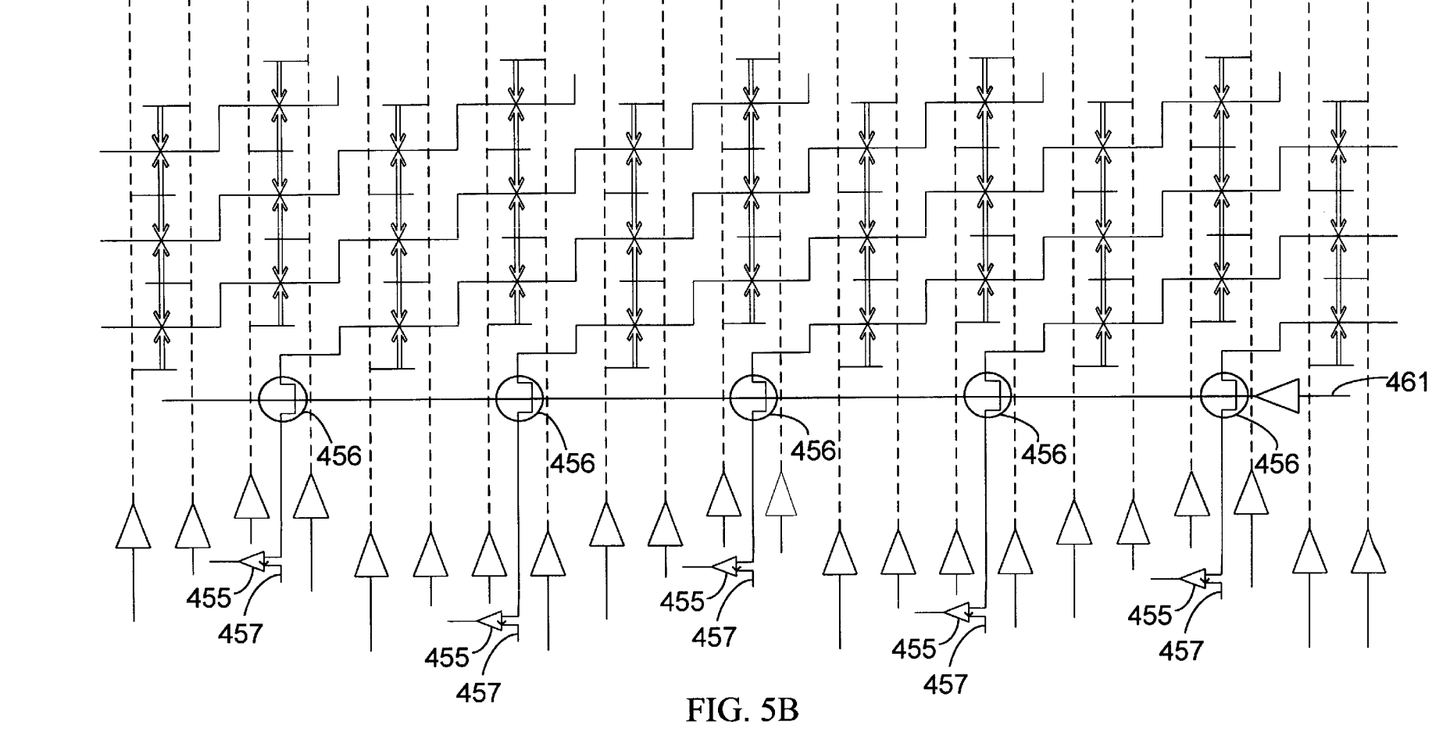
FIG. 5B shows a schematic side elevation view of a portion of the embodiment of FIG. 5A.
Figure 5C:
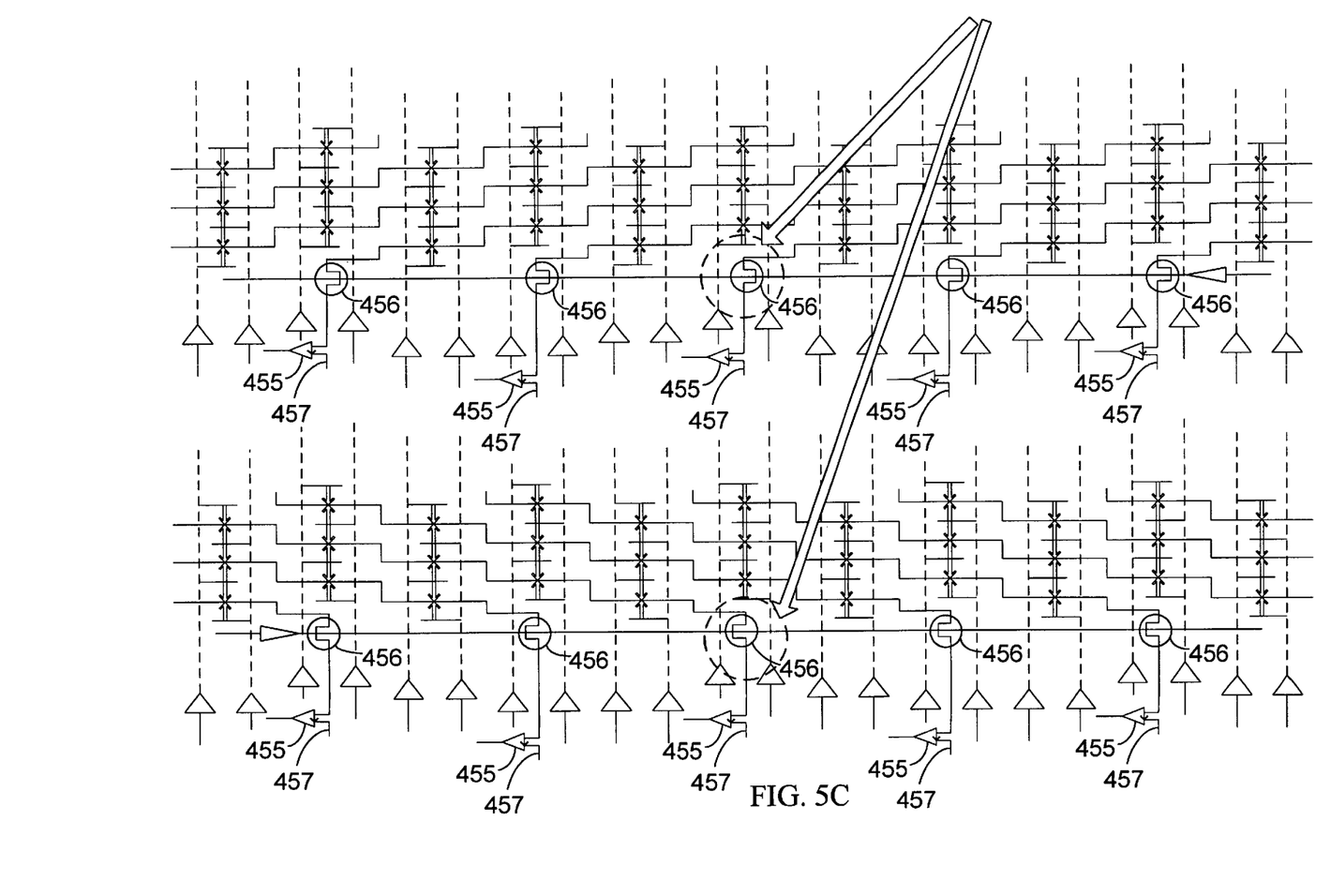
FIG. 5C shows schematic side elevation views illustrating a relationship between two portions of the embodiment of FIG. 5A.

FIGS. 5A–5C show various schematic views of a second embodiment including interconnections made in accordance with the invention. This embodiment differs from the embodiment shown in FIGS. 4A–4C in having two alternating orientations of axes oblique to the planes of memory cells 120 instead of having all the stair-stepped vertical pillar interconnections 410 disposed parallel to each other as they are in FIGS. 4A–4C. As shown in FIGS. 5A and 5C, stair-stepped vertical pillar interconnections 410 are disposed along a first axis oblique to the planes of memory cells 120, while stair-stepped vertical pillar interconnections 415 are disposed along a second axis oblique to the planes of memory cells, where the second axis is inclined in the opposite direction from the vertical. That is, the oblique axes of the two sets of stair-stepped vertical pillar interconnections in FIGS. 5A and 5C are opposed.

FIG. 5C illustrates an advantageous feature of this arrangement: the base semiconductor element 456 may be combined for two pillars and shared by the two pillars. For example, the two base semiconductor elements 456 indicated in FIG. 5C by large arrows and dashed circles may be shared. Base semiconductor control devices 456 are selectively connected to $V_{array}$ (457) through sense amplifiers 455. Otherwise, except for this feature of shared base semiconductor elements and the opposed oblique axes of its vertical pillar interconnections, the embodiment of FIGS. 5A–5C is similar to the embodiment of FIGS. 4A–4C. In particular, the end view of the embodiment of FIGS. 5A–5C is essentially the same as FIG. 4B.

Both of these embodiments have improved volumetric memory cell to interconnection efficiency, i.e., the ratio of memory cell volume to interconnection volume, over prior-art interconnections: e.g., 75% as compared to 50% for a prior-art interconnection structure. With respect to utilization of base silicon area, the embodiment of FIGS. 4A–4C requires only one-third as many base semiconductor devices 456 as a prior-art interconnection structure. By virtue of the device sharing described above, the embodiment of FIGS. 5A–5C requires only one-sixth as many base semiconductor devices as a prior-art interconnection structure.

While a few memory cells, planes, row conductors, and vertical pillar interconnections are shown in FIGS. 4A–4C and 5A–5C, it will be understood that memory 110 may consist of many such elements, and that the arrangements depicted schematically in FIGS. 4A–4C and 5A–5C may be extended both in the two in-plane directions (e.g., along conventional x- and y-axes parallel to each plane) and along a z-axis perpendicularly to the planes. One of the advantages provided by the obliquely angled pillar interconnections and stair-stepped pillar interconnections of the present invention is that extensibility along the Z-axis is essentially unlimited, by virtue of the constant vertical-interconnection overhead.

Thus, an integrated circuit may be made having at least two arrays of cells, with the cells of the arrays being selectively interconnected by an interconnection structure as described herein. This interconnection structure is not merely a set of staggered pillars. Each pillar in an interconnected set is disposed along the same oblique axis extending from the lowest connected layer to the highest connected layer. Specifically, a memory may be made with the memory cells or nodes selectively interconnected by such an interconnection structure, and a mass storage device may be made from such memories. A description of fabrication methods follows.

FABRICATION METHODS

Another aspect of the invention is a method for fabricating an interconnection structure. An embodiment of such a method is illustrated by the flow chart of FIG. 6.

Embodiments of the integrated circuits using the interconnection structure of the invention are fabricated upon a conventional supporting structure such as a flat silicon semiconductor wafer substrate (not shown). Alternatively, the substrate may be made of glass, polymer, plastic, gallium arsenide, silicon on sapphire (SOS), epitaxial formations, germanium, germanium silicon, diamond, silicon on insulator (SOI) material, selective implantation of oxygen (SIMOX) substrates, and/or like substrate materials. Base semiconductor devices may be crystalline or non-crystalline.

Figure 6:
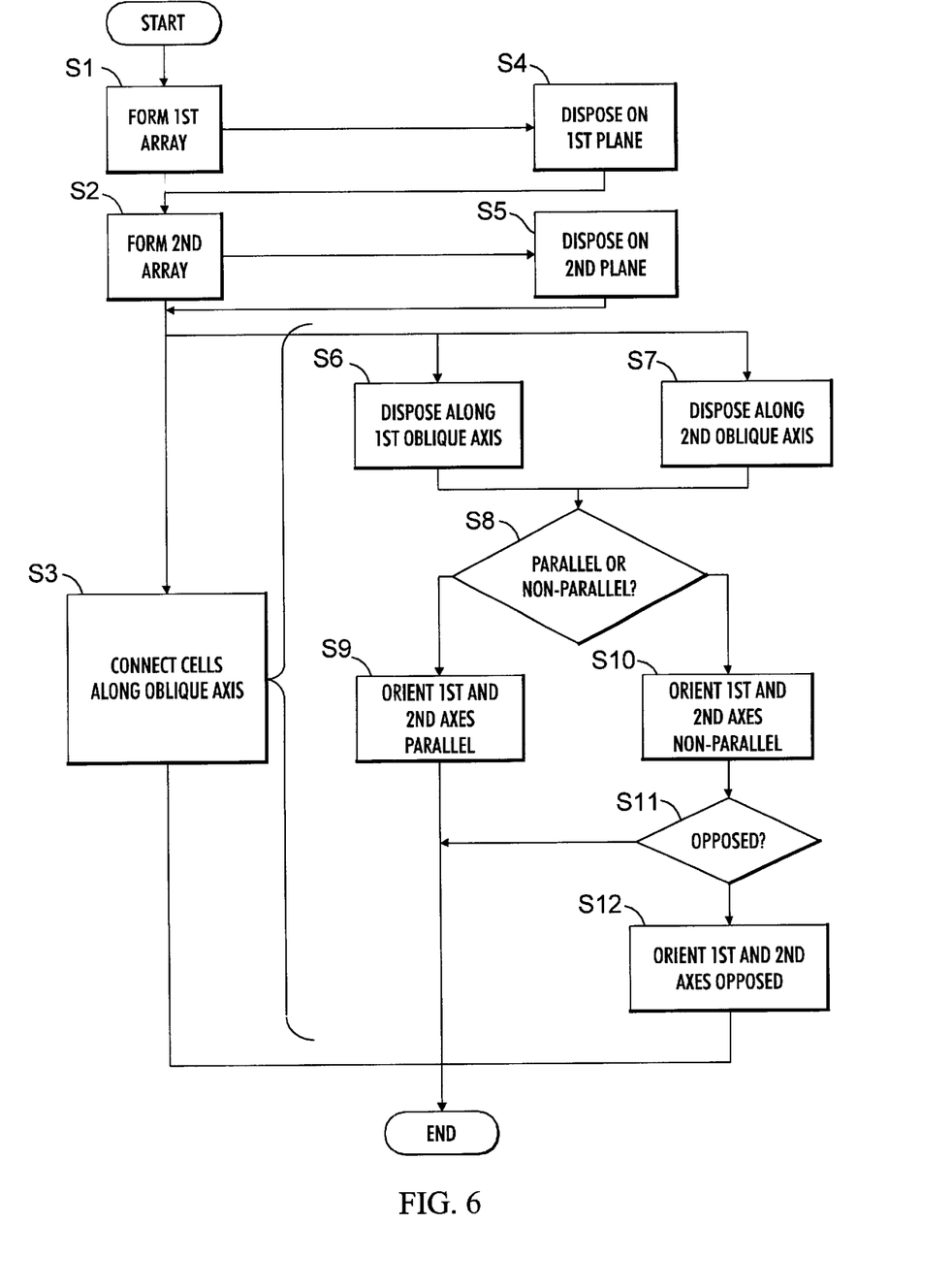
FIG. 6 shows a flow chart illustrating a method for fabricating an interconnection structure in accordance with the invention.

The overall method shown in FIG. 6 comprises steps of forming a first array of cells (S1), forming at least a second array of cells parallel to the first array (S2), and selectively connecting individual cells of the first array with individual cells of the second array by conductive interconnections disposed obliquely to the arrays (S3). In this method, forming steps S1 and S2 are performed by disposing the first array of cells in a first plane (substep S4) and disposing the second array of cells in a second plane (substep S5) parallel to the first plane. Steps S1, S2, S4, and S5 may be performed by conventional semiconductor integrated circuit fabrication processes, including patterning (by photolithography, for example), and deposition of known substances. Conductive elements such as row conductors may be formed by depositing and patterning a conductive material: aluminum, copper, copper-aluminum alloy, silicide, amorphous silicon, microcrystalline silicon, or a refractory metal such as tungsten or an alloy thereof. Such row conductors may have a thickness in a typical range from about 20 nanometers (200 Angstroms) to about 500 nanometers (5000 Angstroms), typically about 180 nanometers (1800 Angstroms).

Electrically insulating layer 35 may be composed, for example, of a material such as wet or dry silicon dioxide ($SiO_2$), a nitride material such as silicon nitride, tetraethylorthosilicate (TEOS) based oxides, borophosphosilicate glass (BPSG), phosphosilicate glass (PSG), borosilicate glass (BSG), polyimide film, polyamide film, oxynitride, spun-on glass (SOG), a chemical vapor deposited (CVD) dielectric including a deposited oxide, a grown oxide, or similar dielectric materials. When composed of TEOS based oxides, insulating layer 35 can be formed by a deposition resulting from the decomposition of a TEOS gas in a reactor.

Connecting step S3 is performed by disposing the conductive interconnections along first and second axes (substeps S6 and S7 respectively), at least one of these axes being oriented obliquely to the first and second planes. One or both of the first and second axes may be oriented obliquely to the first and second planes in substeps S6 and S7. Each of the axes oriented obliquely to the first and second arrays forms an angle between about 30 degrees and about 60 degrees, e.g., about 45 degrees, with at least one of the first and second arrays. If the arrays are in the common parallel relationship, the axes form the same angle with each array.

Figure 7:
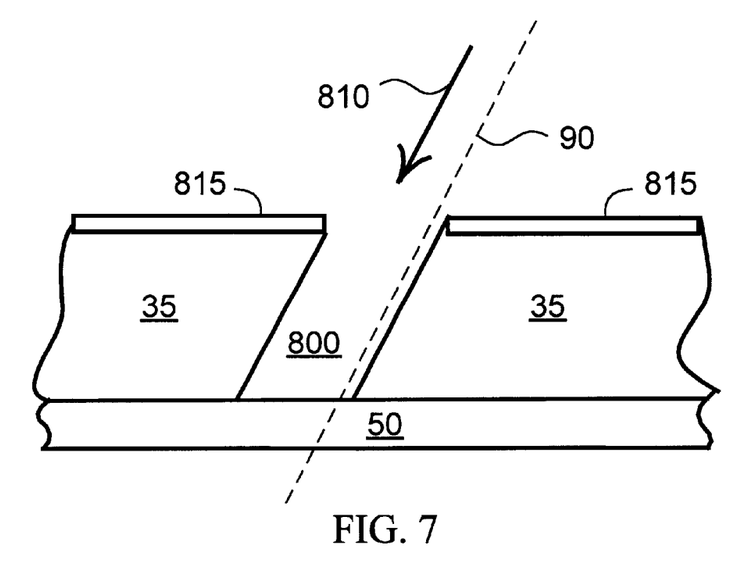
FIG. 7 shows a side elevation cross-sectional view of a portion of an embodiment, illustrating a method for performing a fabrication step.

FIG. 7 shows a side elevation cross-sectional view of a portion of an embodiment, illustrating a particular method for performing step S6 and S7. An oblique opening 800 is formed in insulating layer 35, by directionally etching through openings in a patterned mask 815 and along a direction 810 parallel to desired oblique axis 90. This may be a reactive ion etch, for example. Opening 800 extends down to a conductive portion of cell 50. Opening 800 is filled with a conductive substance to form conductive pillar 400, and if necessary, the conductive substance is planarized to be flush with the top surface of insulating layer 35 to prepare for subsequent fabrication operations.

Figure 8:
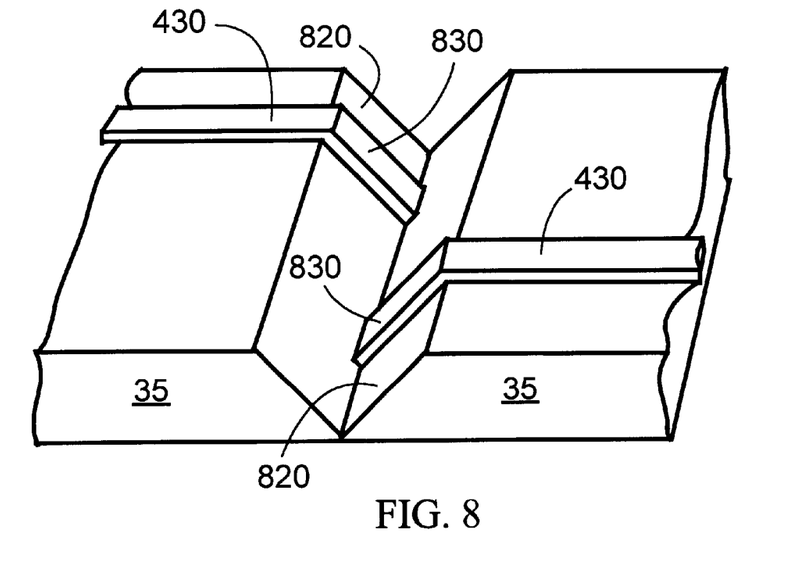
FIG. 8 shows a cutaway perspective view of a portion of another embodiment, illustrating another method for performing a fabrication step.

FIG. 8 shows a cutaway perspective view of a portion of another embodiment, illustrating another method for performing fabrication steps S6 or S7. As shown in FIG. 8, a V-shaped groove with sidewalls 820 oriented at a desired angle suitable for oblique axes 90 is patterned and etched into insulating layer 35. Deposition and patterning of a conductive substance then forms conductive portions 830 suitably oriented to form segments of conductive pillars 400 and, if necessary, may also form horizontal trace segments 430 on the surface of insulating layer 35. The V-shaped groove may be filled with an insulating substance in a subsequent processing step if necessary and then planarized if necessary. To facilitate electrical connection with a conductive trace on the lower layer (below insulating layer 35), the opening may be made with a trapezoidal cross-section instead of the V-shaped groove shown.

In the following paragraphs of this description, two methods of performing substeps S6 and S7 are distinguished. A decision (S8) is made as to which method to perform. In the first method, illustrated in FIG. 4, the first and second axes are made substantially parallel (S9). Such a method provides some advantages, such as being capable of implementation with simpler masks, having improved volumetric efficiency, and using fewer base devices 456 than a prior-art interconnection structure, as explained further herein.

In the second method of performing substeps S6 and S7, the first and second axes are made non-parallel to each other (S10). In a particular variation of this second (non-parallel) method of performing substeps S6 and S7, the first and second axes are made opposed (S12). That is, if this method is selected (S11), the first and second axes are made to slant obliquely in opposite directions from a (third) reference direction perpendicular to the planes of the array, whereby the first and second axes may be said to slant away from (opposed to) each other. A structure made by the latter method is illustrated in FIG. 5. The embodiment illustrated in FIG. 8 also has opposed axes. This second method of making the interconnection structure provides some additional advantages (besides having improved volumetric efficiency), such as allowing a design using even fewer base devices 456 than are needed in the first method using parallel axes. The base-device sharing that makes this improvement possible is described hereinabove.

Another distinct advantage provided by the method of orienting the axes at opposed oblique angles is reduced capacitive coupling between the opposed interconnections and, thus, higher speed and less tendency for crosstalk. In comparison with prior-art interconnection structures, parasitic capacitance is greatly reduced, at least partially due to minimization of the effective total area of overlap between adjacent vertical interconnections. In particular, as shown in the embodiment of FIG. 5A, a multiplicity of pairs of first and second axes may be disposed in alternating opposed relationship, whereby no first axis is adjacent to a parallel second axis. Thus, in FIG. 5A, every other axis of conductive connections slants in the opposite direction. This has the beneficial result of minimizing overlapping area between their respective conductive connections, which thus minimizes capacitance between their respective conductive connections, and thus also increases speed and minimizes crosstalk that otherwise could occur between their respective conductive connections.

Another aspect of performing steps S6 and S7 is the choice of whether each conductive connection between the arrays is made parallel to the axes discussed above (oblique pillars) or is made non-parallel to the axes (stair-stepped pillars). Thus, in step S6, each conductive interconnection along the first axis may be made in the form of a pillar parallel to the first axis, and therefore oblique relative to the planes of the arrays. Similarly, in step S7, each conductive interconnection along the second axis may be made in the form of a pillar parallel to the second axis and thus oblique to the planes of the arrays. On the other hand, step S6 may be performed by making each conductive interconnection along the first axis in the form of a pillar substantially perpendicular to the first and second array planes and parallel to the reference, whereby the conductive interconnections form a stair-stepped set of interconnections. Again, similarly, step S7 may be performed by making each conductive interconnection along the second axis in the form of a pillar substantially perpendicular to the first and second planes and thus parallel to the reference direction mentioned above, whereby those conductive interconnections form a stair-stepped set of interconnections. A person skilled in integrated circuit fabrication will recognize that various combinations of parallel and non-parallel axes and/or oblique and stair-stepped pillar structures may be employed to adapt the methods of the invention to various purposes.

MEMORY EMBODIMENT EXAMPLE

One aspect of a memory embodiment of the present invention is an architecture to support interconnections between multiple layers in a vertical axis above base silicon circuits. Such a memory embodiment, illustrated by FIGS. 4A–4C or FIGS. 5A–5C, may be termed a "vertical memory" or "vertically oriented memory." The memory has word lines, bit lines, and base control devices 456 (e.g., FET devices) for multiplexing the bit lines.

In this memory embodiment, multiple angled or stair-stepped vertical pillars access the various layers, and the memory is comprised of storage elements or nodes formed at the intersections of the multiple angled or stair-stepped vertical pillar access interconnection structure with the word lines within the memory layers. Thus, multiple angled or stair-stepped vertical pillars are utilized to access cells of a vertically oriented memory array. Each cell may be a conventional "1T" DRAM memory cell having a single MOS switching transistor and a storage capacitor, for example.

A particular embodiment for write-once memory arrays includes structures in which a vertical pillar performs the function of the column or bit line and addresses a tunnel junction device. A row conductor is formed either above or below the obliquely angled or stair-stepped vertical pillar conductor. A control element is formed between a row conductor and the obliquely angled or stair-stepped pillar conductor. A single memory storage element or plurality of memory storage elements is formed at an intersection of the obliquely angled or stair-stepped pillar conductor with a row conductor.

Various other embodiments may be made, employing interconnection structures formed according to the present invention. For example, multiple-layer obliquely angled or stair-stepped pillars can access a vertical memory array having a plurality of rows stacked in the Z dimension (i.e., perpendicular to the substrate), with memory elements formed at the intersections of the angled or stair-stepped pillar conductor with each of the stacked rows. Each memory cell, consisting of a series-connected storage element and control element, is constructed at the intersection of the obliquely angled or stair-stepped pillar conductor and one of the stacked rows. The memory element may comprise a resistive storage element in series with a resistive control element.

In such an array, a semiconductor control element at the base of each angled or stair-stepped pillar interconnection is selectable to bit lines via row control lines. More than one pillar interconnection may be shared with a base semiconductor device, as, for example, when obliquely angled pillar interconnections are constructed at opposing angles to maintain access to individual memory elements. Thus, fewer base semiconductor control devices are needed in such an array. Typically only one-third of the number of base semiconductor control devices are needed, compared with structures using conventional pillar interconnections.

In a related embodiment, the storage element can comprise a tunnel-junction oxide that exhibits a high off-state resistance before being fused and exhibits a low on-state resistance after being fused with sufficient energy to form a low resistance filament between the electrodes. Similarly, the control element can comprise a tunnel-junction oxide that exhibits a high read-state resistance and a low write-state resistance.

Supporting circuitry may be provided for memory made in accordance with the invention, including provision for row control selection of pillars, common drive interconnection, and/or sense lines. Each pillar conductor may have a semiconductor control device connected at its base. In one embodiment, the semiconductor device connected at the base of each pillar is a field-effect transistor (FET) whose gate is controlled by a device external to the array. Row control elements control the gates of the pillar FET's across a row through the array. Each pillar is selectable by means of a line or lines orthogonal to the row control lines.

The supporting circuitry for obliquely angled or stair-stepped pillar access memory can provide multiplexing of horizontally or vertically oriented column interconnection lines in the layers of memory that intersect with the obliquely angled or stair-stepped pillar conductors. The layers of horizontal or vertically oriented interconnections through the vertical memory layers are controlled by conventional functional elements external to the array and operated in drive mode or sense mode. When these interconnection lines are used in sense mode, the functional elements external to the array comprise sense amplifier circuits for read and write current comparisons. These lines can also be used to provide read and write voltage references, in which case the functional elements external to the array comprise the read and write voltage reference sources and multiplexing.

While the structure has been described beginning with a simple embodiment having two layers, other embodiments may have a multiplicity of arrays, each array being disposed in a layer. Thus, cells on a multiplicity of layers are selectively interconnected, as illustrated in the embodiments of FIGS. 2 and 3. For some applications, the structure may have two to eight layers, for example. Other embodiments of the structure may have from eight to twelve layers. Unlike many other structures known in the art, which have an overhead cost associated with each layer, there is no known limit to the number of layers that can be accommodated in a structure made in accordance with the present invention. Thus, there may be even more than twelve layers, the number of layers being essentially unlimited.

INDUSTRIAL APPLICABILITY

The interconnection structures of the invention are especially useful in semiconductor devices such as memory integrated circuits. Integrated circuits of many types, including such integrated circuit types as the memory embodiment example described above, may be made with interconnection structures fabricated in accordance with the invention. Such structures and integrated circuits employing them are useful in apparatus such as mobile or stationary telephones, digital cameras and camcorders, computing devices (such as desktop and portable computers, calculators, and personal digital assistants (PDA's) and their peripheral devices), media players such as players for CD's, DVD's, music, and video, and apparatus for printing, scanning, storing, copying, facsimile reproduction, and transmitting of documents. The latter apparatus may include multifunction devices.

Other embodiments of the invention will be apparent to those skilled in the art from a consideration of this specification or from practice of the invention disclosed herein. For example, obliquely angled or stair-stepped pillars may be arranged along multiple sets of pairwise-parallel oblique axes and/or multiple sets of pairwise opposed oblique axes. It is intended that the specification and examples disclosed herein be considered as exemplary only, with the true scope and spirit of the invention being defined by the following claims. Accordingly, the scope of the invention should be determined not by the embodiments illustrated, but by the appended claims and their legal equivalents.

What is claimed is:

1. An interconnection structure comprising:
   a) a first set of wiring channels disposed in a first plane,
   b) a second set of wiring channels disposed in a second plane generally parallel to said first plane, and
   c) at least a third set of wiring channels oriented obliquely to said first and second planes, the wiring channels of said third set being adapted for electrically coupling selected wiring channels of said first set with selected wiring channels of said second set.

2. A structure for integrated circuits, said structure comprising:
   a) a first array of cells,
   b) at least one second array of cells, and
   c) interconnections adapted for electrically coupling cells of said first array with cells of said second array, at least some of said interconnections being disposed along axes oriented obliquely to said first and second arrays and being electrically coupled to each other.

3. A structure as in claim 2, wherein each of said interconnections is selectively coupled by an electrical coupling to a cell of said first array.

4. A structure as in claim 2, wherein each of said interconnections is selectively coupled by an electrical coupling to a cell of said second array.

5. A structure as in claim 2, wherein each of said axes oriented obliquely to said first and second arrays forms an angle with one of said first and second arrays, said angle being between about 30 degrees and about 60 degrees.

6. A structure as in claim 5, wherein each of said axes oriented obliquely to said first and second arrays forms an angle of about 45 degrees with one of said first and second arrays.

7. A structure as in claim 2, comprising a multiplicity of arrays, each array of said multiplicity being disposed in a layer, whereby cells on a multiplicity of layers are selectively interconnected.

8. A structure as in claim 7, wherein said multiplicity of layers comprise from two to eight layers.

9. A structure as in claim 7, wherein said multiplicity of layers comprise from eight to twelve layers.

10. A structure as in claim 7, wherein said multiplicity of layers comprise twelve or more layers.

11. A structure as in claim 2, wherein said at least some of said interconnections are adapted to provide a volumetric efficiency of 75%.

12. A structure as in claim 2, wherein each cell of said cells of said first and second arrays comprises a semiconductor device.

13. A structure as in claim 2, wherein said cells of said first and second arrays are memory cells.

14. A structure as in claim 13, wherein each cell of said cells of said first and second arrays comprises a semiconductor device.

15. A structure as in claim 13, wherein each of said memory cells comprises a storage element and a control element.

16. A structure as in claim 15, wherein said storage element of each memory cell is connected in series with said control element of that memory cell.

17. A structure as in claim 13, wherein each memory cell is disposed at the intersection of an angled vertical pillar conductor with one of said first or second arrays of cells.

18. A structure as in claim 13, wherein each memory cell is disposed at the intersection of a stair-stepped vertical pillar conductor with one of said first or second arrays of cells.

19. An integrated circuit comprising at least two arrays of cells, said cells of said arrays being selectively interconnected by a structure as recited in claim 2.

20. A memory comprising at least two arrays of cells, said cells of said arrays being selectively interconnected by a structure as recited in claim 2.

21. A mass storage device comprising at least one memory as recited in claim 20.

22. A structure for integrated circuits, said structure comprising:
   a) a multiplicity of arrays of cells, each array of said multiplicity being disposed in a layer, said multiplicity of arrays including a first array of cells disposed in a first layer and at least one second array of cells disposed in a second layer, and
   b) interconnections adapted for electrically coupling cells in said first layer with cells of at least said second layer, at least some of said interconnections being disposed along axes oriented obliquely to said first and second layers and being electrically coupled to each other, whereby cells in a multiplicity of layers are selectively interconnected.

23. A structure for integrated circuits, said structure comprising:
   a) a first array of cells,
   b) at least one second array of cells, and
   c) interconnections adapted for electrically coupling cells of said first array with cells of said second array, at least some of said interconnections being disposed along axes oriented obliquely to said first and second arrays and being electrically coupled to each other, said at least some of said interconnections being further adapted to share a number of base semiconductor devices, said number being one-third to one-sixth of a quantity of base semiconductor devices used otherwise without sharing.

24. A method for fabricating a structure, said method comprising the steps of:
   a) forming a first array of cells,
   b) forming at least a second array of cells generally parallel to said first array, and
   c) selectively coupling individual cells of said first array with individual cells of said second array by conductive interconnections disposed along at least one axis oriented obliquely to said first and second arrays.

25. A structure fabricated by the method of claim 24.

26. The method of claim 24, wherein said forming steps (a) and (b) are performed by disposing said first array of cells in a first plane and disposing said second array of cells in a second plane parallel to the first plane.

27. The method of claim 26, wherein said selective coupling step (c) is performed by disposing said conductive interconnections along first and second axes, at least one of said axes being oriented obliquely to said first and second planes.

28. The method of claim 27, wherein both of said first and second axes are oriented obliquely to said first and second planes.

29. The method of claim 27, wherein said first and second axes are parallel.

30. A structure fabricated by the method of claim 29.

31. The method of claim 27, wherein said first and second axes are non-parallel.

32. The method of claim 31, wherein said first and second axes slant in opposite directions from a third axis perpendicular to said first and second planes, whereby said first and second axes are opposed.

33. The method of claim 32, wherein a multiplicity of pairs of said first and second axes are disposed in alternating opposed relationship, whereby no first axis is adjacent to a parallel second axis.

34. The method of claim 32 wherein said first and second axes are suitably disposed to minimize overlapping area between their respective conductive connections.

35. The method of claim 32 wherein said first and second axes are suitably disposed to minimize capacitance between their respective conductive connections.

36. The method of claim 32 wherein said first and second axes are suitably disposed to minimize crosstalk between their respective conductive connections.

37. A structure fabricated by the method of claim 31.

38. The method of claim 27, wherein each conductive interconnection along said first axis is made in the form of a pillar parallel to said first axis.

39. The method of claim 27, wherein each conductive interconnection along said second axis is made in the form of a pillar parallel to said second axis.

40. The method of claim 27, wherein each conductive interconnection along said first axis is made in the form of a pillar substantially perpendicular to said first and second planes, whereby said conductive interconnections form a stair-stepped set of interconnections.

41. The method of claim 27, wherein each conductive interconnection along said second axis is made in the form of a pillar substantially perpendicular to said first and second planes, whereby said conductive interconnections form a stair-stepped set of interconnections.

42. A structure for integrated circuits, said structure comprising:

a) a first array of cells, b) at least one second array of cells, and c) interconnections disposed for connecting cells of said first array with cells of said at least one second array, at least some of said interconnections being disposed along axes oriented obliquely to said first and second arrays, each of said interconnections being selectively connected by an electrical connection to a cell of at least one of said first and second arrays, said electrical connection comprising an element selected from the list consisting of an ohmic connection, a switching device, a semiconductor device, a diode, a field-effect transistor, an antifuse, and a fusible element.

43. An integrated circuit comprising at least two arrays of cells, said cells of said arrays being selectively interconnected by interconnections adapted for electrically coupling cells of said first array with cells of said second array, at least some of said interconnections being disposed along axes oriented obliquely to said first and second arrays and being electrically coupled to each other.

44. A memory comprising at least two arrays of cells, said cells of said arrays being selectively interconnected by interconnections adapted for electrically coupling cells of said first array with cells of said second array, at least some of said interconnections being disposed along axes oriented obliquely to said first and second arrays and being electrically coupled to each other.

45. A mass storage device comprising at least one memory, said memory comprising at least two arrays of cells, said cells of said arrays being selectively interconnected by interconnections adapted for electrically coupling cells of said first array with cells of said second array, at least some of said interconnections being disposed along axes oriented obliquely to said first and second arrays and being electrically coupled to each other.

46. An interconnection structure comprising:

a) a first set of wiring means disposed in a first plane, b) a second set of wiring means disposed in a second plane generally parallel to said first plane, and c) means for electrically coupling selected wiring means of said first set with selected wiring means of said second set, said means for electrically coupling being disposed along at least one axis oriented obliquely to said first and second planes.

* * * * *